United States Patent

Gallotti et al.

[11] Patent Number: 6,031,376
[45] Date of Patent: Feb. 29, 2000

[54] DEVICE FOR THE STANDARDIZATION OF SIGNAL INTENSITY IN THE MAGNETIC RESONANCE IMAGES FORMATION TECHNIQUE

[75] Inventors: Angelo Gallotti; Christoph De Haen, both of Milan, Italy; Anne Marie Smith, Glen Gardner, N.J.; Michael N. Eakins, East Windsor, N.J.; Julius P. Zodda, Mercerville, N.J.

[73] Assignee: Dibra S.p.A., Milan, Italy

[21] Appl. No.: 08/802,631

[22] Filed: Feb. 19, 1997

[30] Foreign Application Priority Data

Feb. 21, 1996 [IT] Italy .................................. MI96A0328

[51] Int. Cl.[7] ..................................................... G01V 3/00
[52] U.S. Cl. .......................... 324/309; 324/300; 324/307; 600/410; 600/420
[58] Field of Search ..................................... 324/300, 307, 324/309, 318, 308, 18, 322; 600/410, 420, 421, 426, 431, 432, 610, 642, 424

[56] References Cited

U.S. PATENT DOCUMENTS

| | | | |
|---|---|---|---|
| 4,528,510 | 7/1985 | Loeffler et al. | 324/309 |
| 4,665,364 | 5/1987 | Hanawa . | |
| 4,804,261 | 2/1989 | Kirschen | 351/158 |
| 4,916,170 | 4/1990 | Nambu et al. | 523/137 |
| 5,005,578 | 4/1991 | Greer et al. | 600/414 |
| 5,070,876 | 12/1991 | Wright | 324/306 |
| 5,178,146 | 1/1993 | Giese | 324/308 |
| 5,708,993 | 1/1998 | Campbell et al. | 5/86.1 |

FOREIGN PATENT DOCUMENTS

| | | |
|---|---|---|
| 0 105 220 | 4/1984 | European Pat. Off. . |
| 0 152 069 | 8/1985 | European Pat. Off. . |
| 0 228 682 | 7/1987 | European Pat. Off. . |
| 9604844A1 | 2/1996 | WIPO ................................... 324/308 |
| WO 9604844A1 | 2/1996 | WIPO . |

OTHER PUBLICATIONS

Edelman et al. Clinical Magnetic Resonance Imagning. vol. 1, pp. 177–191, 1996.
Physics in Medicine and Biology vol. 34, No. 1, Jan. 1989 pp. 5–22 Walker et al A Test Material for Tissue etc.

*Primary Examiner*—Christine Oda
*Assistant Examiner*—Brij B. Shrivastav
*Attorney, Agent, or Firm*—Nixon & Vanderhye

[57] ABSTRACT

Devices, and a method for the use thereof, for the standardization of signal intensity in the formation of magnetic resonance images of the human body, said devices including one or more straight, bent or flexible closed tubes with an external diameter not greater than 3 cm, an internal diameter of not less than 0.2 cm and a length of not less than 8 cm, made of susbtantially diamagnetic material, other than glass, preferably a plastic material, particularly polyvinyl chloride, each of them being filled with aqueous solutions or gels containing paramagnetic components, said tubes being kept close to the body either by means of the positioning devices of the body to which they are fixed permanently or temporarily, or by fixings which, on one side, can be fixed to the human body and on the other keep the tubes in the required positior.

1 Claim, 1 Drawing Sheet

DEVICE FOR THE STANDARDIZATION OF SIGNAL INTENSITY IN THE MAGNETIC RESONANCE IMAGES FORMATION TECHNIQUE

BACKGROUND OF THE INVENTION

This invention concerns devices for the standardization of signal intensity in the magnetic resonance imaging of the human or animal body.

Magnetic resonance images (MRI) of the human or animal body, particularly of the brain, with or without the injection of a suitable contrast medium, is an important diagnostic technique. MRI requires positioning the patient, entirely or in part, inside a strong magnet which creates a homogeneous static magnetic field. With the help of coils, weak magnetic field gradients are superimposed on the static field and radio frequency, electromagnetic impulse fields are applied.

A number of detector coils receive the electromagnetic signals, which are processed to represent raw digital signal intensities (SIr), expressed in arbitrary units, of an anatomic section or volume, described by means of pixel or voxel matrices respectively.

Very often, the raw digital signal intensity (SIr) represents the base for making quantitative evaluations concerning, for example, the increase of the signal intensity in a certain region after administering a contrast medium for MRI, or comparisons of different patients, or between signals received from the same patient at different times, when the identical signal acquisition parameters are kept identical.

Unfortunately SIr is greatly influenced by performance variations with time, which are typical of the MRI machine. These variations, although of modest proportions, must be corrected, or normalized, to make it possible to obtain valid quantitative comparisons between signal intensities monitored at different times.

This correction may be obtained by situating an appropriate standardized source of signal intensity in the immediate vicinity of the patient's body, within the section or volume whose image is to be obtained (this source could be, for example, an aqueous solution of 1 mM nickel chloride), and comparing the SIr values of the image with the signal intensity of the standard (SIst). As a result, the correct, or normalized signal intensity, (SIn) can be expressed using the following formula:

$$SIn = \frac{SIr}{SIst}$$

Similarly, the normalized values of the signal increase due to administration of a contrast medium can, for example, be obtained by measuring the ratios of the normalized signal intensities (SIn) of the region concerned, calculated before and after administration of the above medium, whereas the SIn values are calculated as described above.

Different normalization algorithms may also be used, but in fact all of them give comparable results. To give just one example, it is possible to normalize the signal intensity by simple proportion, assigning a prefixed numeric value to the standard, The normalization of the signal intensity above described, is highly desirable, if not absolutely indispensable, to improve and make reproducible the comparisons between different patients, or even before and after administration of the contrast medium to the same patient at routine diagnostic procedure level. This in fact is indispensable if computerized—or computer-assisted diagnoses—based on digital imaging are to have a future.

In order to generate an image, the SIr values must be mapped on a discrete scale of greys. The mapping parameters are chosen manually or automatically to obtain the maximum dispersion of gray levels in the anatomic areas concerned. This produces images of the same corporeal regions in different patients only roughly comparable, but does not allow rigourous quantitative comparisons to be made.

The improvement in comparability of the images produced on the basis of a discrete gray scale may be achieved by first normalizing the SIr signal intensity with the help of a standard, as described above, and then imposing a correlation between two values chosen on the scale of the corrected digital signal intensities and two corresponding values on the scale of greys. Preferably, the first corresponding values are chosen inside the lower 40% range of the observed values while the second pair of corresponding values is chosen inside the higher 40% range. These values can be selected quite easily by a software supplied with the imager, which automatically maps the scale of signal intensities observed on the gray scale.

From the point of view of imaging only, it is better that the standard is placed as close as possible to the object being examined, because in this way the lack of homogeneity in the radio frequency electromagnetic field close to the coils is minimized.

The standard can be made up with a sufficiently large volume of a protic liquid, having well-defined longitudinal and transversal protonic magnetic relaxation speeds.

In order to obtain the required standardization, attempts have already been made to use sealed glass bottles or tubes containing solutions of paramagnetic salts, placed close to the patient, inside the chosen NMR imaging plane. This has not proved to be very practical, as the doctor cannot easily foresee all the planes he needs to take, and changing the position of such a standard involves removing the patient from the magnet—which leads to a considerable waste of time and thus increases the procedure's cost.

In addition, glass is fragile and this means that long tubes suitable for the imaging of the entire body are impractical if not even impossible to use.

Usually, these improvised standards were placed on the table on which the patient lies. In some cases they have been fixed to the patient with adhesive tape, or the patient has been asked to hold the standard in his hand. In the case of magnetic resonance of the head the problem is made even more serious due to the fact that the space available inside the room is extremely limited, and a standard of this type can very easily get too close to the coils of the head, thus invalidating the correctness of the results obtained. Probably the unconventionality and unreliability of such improvisations constituted some of the reasons for which the use of a standard has not been more widely adopted or applied in routine clinical practice.

The objective of the invention is thus to eliminate the inconveniences described above and to provide extremely reliable standards, which may be used simply and safely, without the need for the technicians that use them to be specially trained.

An additional objective of the invention is the realization of simple and economical standards, which can be re-used a large number of times, and can be easily adapted to the part of the human body to be analyzed.

The preferred aspects of the invention are described in the corresponding sub-claims.

DETAILED DESCRIPTION OF THE INVENTION

A surprisingly simple, versatile and practical solution has now been found for the technical problem described above.

Flexible tubes of diamagnetic material having low permeability to water were completely filled with a paramagnetic aqueous composition with a prefixed MRI protonic signal intensity (SIst).

The flexible tubes are preferably made of rubber or plastic and heat-sealed or mechanically closed at both ends, using only diamagnetic materials.

As diamagnetic material for tubes it has been found, for example, that polyvinyl chloride (PVC) fully satisfies the requirements for prolonged stability of the sample, due to its low permeability to water vapor. The outside surface of these tubes may be repeatedly washed with water and disinfected, for example, with 70% of ethyl alcohol, and consequently these flexible tubes may be re-used a large number of times.

The tubes thus filled are positioned along the external contour of the part of the body concerned—for example the head, the abdomen, the knee—in such a way that the NMR images contain also at least a section of the tube. Of course, at least one of the above possible sections of the standard must be of the transversal type. In order that this transversal section of the tube may provide an adequate standard, its internal diameter must be at least 0.2 cm, preferably between 0.5 and 3 cm. The external diameter of the tubes should preferably be between 0.4 and 3.5 cm.

The tubes may be of any length appropriate to their specific use; preferably from a minimum of 5 cm up to 2 m and more for an analysis of the entire body.

For magnetic resonance of the head, the length of the tubes may, for example, range from 15 to 55 cm, depending on whether they are to cover the entire cranium or only half of it.

The tubes may be either attached, or may just rest on the devices that keep the patient's body in the correct position—such as, for example, the table or the anatomic pillow—so as to be as close as possible to the body. Alternatively, the tubes may be fixed to the part of the body concerned using suitable fixing devices.

In every case, these tubes are positioned very close to the body—although not necessarily in contact with the skin—with their longitudinal axes roughly perpendicular to the desired planes in which the image is taken.

Figure 1A:
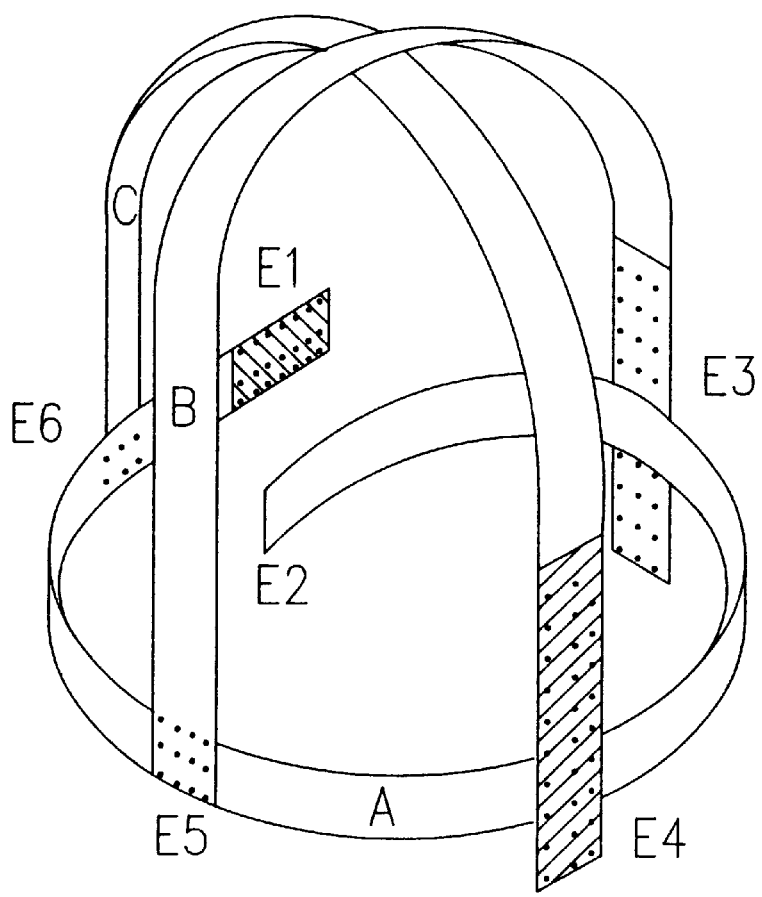
FIG. 1A is a perpective view of a reversible helmet of the invention in its assembled state.
Figure 1B:
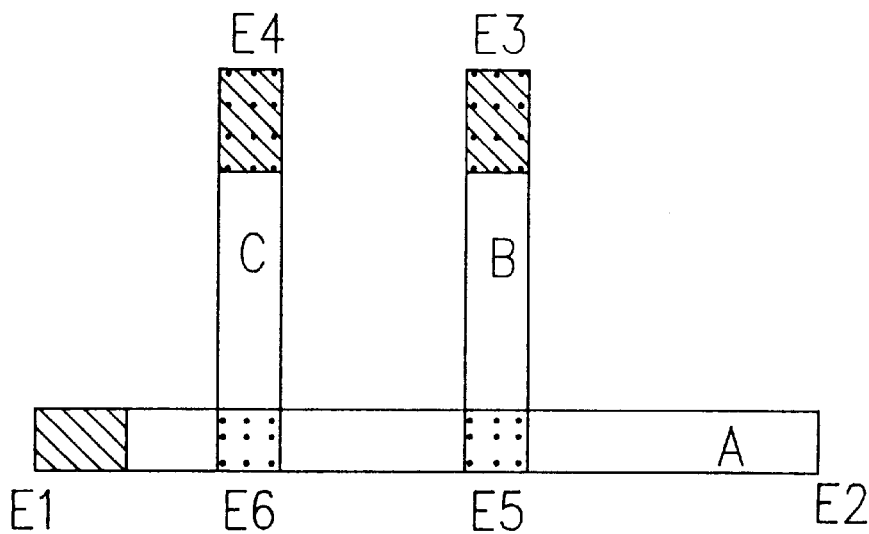
FIG. 1B is a plan view of the helmet in its disassembled state.

The fixing devices may be simple—such as tapes that can be wound around the body—or more complex—such as a soft, adjustable, multi-dimensional helmet (FIG. 1). The fixing devices may be either disposable or washable and re-usable.

The tubes may be attached permanently or temporarily to the devices that keep the body in the required position; for example they may be fixed to—or even inserted—in the anatomic pillow.

They may also be fixed either permanently or temporarily to the devices for connection of the patient to the apparatus. Rings made of plastic or cloth may be used to keep them in place, and several rings may enable the tube to be positioned in more than one direction for the same attachment device. The fixing devices may also be made of elastic material. A particularly efficacious embodiment consists in the use of hook and fasteners such as Velcro® fasteners. For example, a strip of this material is glued to one side of the tube, while the attachment device has pieces of Velcro placed in corresponding positions so as to allow the tube to be fixed in all the directions required. The invention will be easier to understand after reading the examples that are given below and on the basis of FIG. 1, which shows a particularly successful implementation of a standardization device in accordance with the invention, usable for imaging the head. Thanks to the tubes described in the invention it is possible to obtain precise and reproducible quantitative correlations both when the examination concerns just one patient—for example comparing the images obtained before and after administration of the contrast medium—and when it is required to compare the responses of different patients.

The particular flexible material used makes it possible to position the standard in all possible positions before inserting the patient in the NMR imager, thus avoiding the possibility of having to suspend the procedure, and remove the patient from the machine to re-position the standard. The improvement is evident not only from the economic point of view (the entire procedure takes less time) and the quality of the final images produced, but—above all—as regards the patient's comfort.

None of the above could evidently be obtained with the glass bottles which were occasionally used previously. The glass could easily break, with all the consequent dangers both for the patient and the operators.

Furthermore—not to be ignored for routine application in medical practice—the characteristics of versatility and simplicity of use of the tubes forming part of the invention should be noted, as well as the low running costs, thanks to the material used and its prolonged re-usability.

Consequently, the material that can be used for making the tubes of the invention is a substantially diamagnetic material (but not glass)—such as, for example, ceramic, rubber, or plastic (including reinforced plastic). For the purpose of the invention, flexible plastic materials have been found to be most appropriate, particularly polyvinyl chloride and other polymers having similar properties of flexibility, impermeability, and resistance.

The tubes may be filled with aqueous solutions or gel containing as paramagnetic components salts, compounds, or metallic chelates in which the metallic component is made of bi- or trivalent ions of the elements with atomic numbers ranging from 20 to 31, 39, 42, 43, 44, 49, or between 57 and 87. Equally suitable—preferably in the form of aqueous gels—are suspensions of paramagnetic or superparamagnetic particles.

These standardized tubes may contain paramagnetic solutions of different concentrations, depending on diagnostic requirements, the longitudinal protonic relaxation rate $R_1$ of the above solutions should preferably be between $0.1\ \text{s}^{-1}$ and $40\ \text{s}^{-1}$.

Also the invention's devices for attaching the tubes to the body positioning equipment or the devices for attaching them to the body itself—as also the attachment devices themselves—must be made of a diamagnetic material, possibly also of the disposable type, and comprising cloth, rubber, plastic or reinforced paper, suitably shaped and assembled in accordance with the specific use.

EXAMPLE 1

A tube of polyvinyl chloride with an internal ø of 1 cm, and an external ø o of 1.3 cm and 45 cm long is thermo-welded at one end. 5 cm of the other end are thermally stretched and cut to form a narrow entry hole. The tube is then filled as completely as possible with a 1 mM solution of nickel chloride. The open end is thermo-welded. The longitudinal protonic relaxation rate $R_1$ in a 1 mM aqueous solution of nickel chloride in a test tube measured in a Minispec® (Brucker) operating at 2T, produces an $R_1$ value of $0.948\pm0.039$ s$^{-1}$. $R_1$ inside the PVC tube is calculated by the images taken in an MRI imager (SMIS) at 2T using a validated "T1-mapping" procedure (R. Deichmann and A. Maase; Quantification of T1-values by SNAPSHOT-FLASH NMR Imaging, J. Magn., Res. 96, 608–612, 1992). The value found, $R_1=0.918\pm0.062$ s$^{-1}$, is virtually identical to that measured in the sample, demonstrating that the plastic material of the tube does not influence the magnetic properties of its contents.

EXAMPLE 2

Tubes prepared in the same way as described for Example 1 were stored at 45° C. and 40% humidity and their weight was monitored every 15 days. No significant loss of weight was observed over time, after a minimum of six months.

EXAMPLE 3

The tube filled as described in Example 1 was fitted with a 33 cm diameter ring 5 cm from the end, using a cloth tape fitted with press-buttons so that it could be opened and closed for adjustment. A 150 cm length of cloth tape was glued 20 cm from the other end of the tube.

The ring was arranged around the collar of the patient being subjected to abdominal magnetic resonance. The tube was then positioned lengthwise over the clothing on the patient's abdomen as the patient lay supine, and the other end was tied round the body using a cloth tape. In this way it was then possible to carry out the required MRI survey in the desired standard conditions.

EXAMPLE 4

The 55 cm long tube, filled as described in Example 1, was held against the abdomen of patients lying on the imager table and fixed to the bed sheet using adhesive tape.

EXAMPLE 5

Three rings sewn on a 2 cm length of fixing tape fitted with hook and loop fasteners were positioned so as to run freely on a 55 cm length of tube filled as described in Example 1, with the adhesive side of the fasteners facing outwards; the rings were then positioned towards the two ends of the tube and at its centre. Auxiliary 2 cm length of fixing tape fitted with Velcro fasteners were glued to the border of the cavity of a anatomic pillow, approximately at the crown of the head and at the two positions of the jaw angle. The tube was subsequently fixed to the above cushion in the form of a V using these fixing means fitted with Velcro fasteners.

EXAMPLE 6

A standard cushion for positioning the head in the imager for scanning the cranium was modified so as to contain a groove for holding a tube of the type described in Example 1. The groove was made roughly parallel to the edge of the cavity for the head and extended approximately from one corner of the jaw to the other. In this way it was possible to insert the standardized tube at a different depth and it was subsequently possible to wash the cushion separately from the tube itself.

EXAMPLE 7

A standard cushion for positioning the head in the imager for scanning the cranium was modified so as to permanently contain a tube of the type described in Example 1, embedded in the foamed plastic of the cushion, with the tube running roughly parallel to the edge of the head cavity and extending roughly from one corner of the jaw to the other.

EXAMPLE 8

Attachment Device in the Form of Reversible Helmet

A flexible reversible helmet was developed, as shown in FIG. 1, made of 100% polyamide, complete with 2 cm wide strips of hook and loop fasteners. With the exception of the zones shown in dotted lines in the above drawing, the adhesive side was always turned facing away from the head.

The helmet comprises a 70 cm base tape (A) fitted at one end (E1) with a 2 cm strip of adhesive of opposite polarity on the inside face of the tape, so as to allow tape (A) to be closed in the form of a ring with an adjustable diameter.

Two other transverse tapes—B and C—were fixed perpendicularly to base tape A and centred respectively at 32 cm (position E5) and 18 cm (position E6) from end E1. Each of the transverse tapes B and C had the ends, respectively E5 and E6, sewn to base tape A and had at the other end, respectively E3 and E4, a section of internal adhesive with opposite polarity designed for attaching to the external surface of the base tape A.

For use, position E5 of base tape A is centred on the patient's forehead, and the ring is closed at the back of the head (above the neck). The transverse tapes B and C are positioned in the form of a cross on the cranium in the most appropriate positions and fixed by pressing together the respective ends E3 and E4 to base A tape. Of course, a helmet of this type may also be made using different materials and techniques, or with a different fitting system, but in every case a simple task for a skilled technician. For example, the adhesive for closing the tape/ring A may be fitted at end E2 instead of E1, without any adverse effects on the device's functioning.

Similarly, circle A may be made of flexible plastic material with adjustable closing (the same could apply also for B and C). In this way a semi-rigid helmet of the permanent type would be obtained, which would have the advantage of keeping the standard tubes in the required position better. On the other hand, the reversible helmet previously described has undoubted advantages from the point of view of cost and the space occupied when not being used.

Other variations are plainly apparent to the skilled technician, and form part of the scope of the invention and the example given.

EXAMPLE 9

Fitting a Tube on the Helmet

A 45 cm long tube was filled and prepared as described in Example 1.

Hook and loop fasteners rings with an internal diameter of 1.2 cm were prepared, with the adhesive part on the outside, and three of these were fitted on it. By positioning the rings appropriately on the tube, the latter could be attached to the helmet described in Example 8 on a patient in any desired direction, with the tube thus following the frame of the head.

EXAMPLE 10

The reversible helmet described in Example 8 and the rings (with a fixing means that closes on contact as shown in Example 5) were washed ten times at a temperature of 60° in a washing machine using washing powder and the feasibility of employing the above items for continuous use was confirmed.

EXAMPLE 11

Tubes were prepared as described in Example 1 and filled with 70% ethyl alcohol instead of nickel chloride solution. The loss of weight at 40° C. after 30 days was found to be less than 0.6%, showing that the ethyl alcohol did not significantly permeate through the polyvinyl chloride.

Although the preliminary descriptions and the examples given above have always referred to plastic as a diamagnetic material for the production of the tubes, any other diamagnetic material—except glass—is suitable for the purpose, such as ceramic, rubber, or similar.

It is also evident that other means besides those described can be adopted for fixing the tubes, while remaining within the scope of the invention, as defined in the attached claims.

EXAMPLE 12

Tubes prepared as in Example 1 were cleaned with a cloth soaked in 70% of alcohol. Bacteriological tests before and after cleaning showed that after the cleaning, the surface was largely sterile.

EXAMPLE 13

A patient suffering from a brain tumour was inserted in a General Electric Sigma MRT imager at 1.5T and head scans (T1 weighted, Spin Echo 500/200; TR/TE) were taken before and after administration of a standard dose of 0.1 mmol/kg of a paramagnetic contrast medium available on the market. Regions of Interest (ROI) were defined in zones of normal white matter and in tumorous areas, obtaining SIr values and the relative standard deviations for the corresponding tissue. Before the administration of the contrast medium SIr values obtained from the healthy tissue and the diseased ones were 160±13 and 139±11, respectively. After the administration of the contrast medium these values were 141±13 and 231±28 respectively. A direct comparison of the SI values pre- and post-contrast was not possible due to re-normalization of the image due to the equipment's software, which assigns the high level of gray (#255 in this case) to the highest pixel values (in the present case, max. SI is that of the pixel of the tumour, after contrast) and which consequently lowers all the other SI values so as to obtain a correct ratio between the signal intensity of each pixel relative to max. SI.

In the specific case, an SI value of 141±13 after contrast was obtained for the healthy tissue, with a nominal diminution of 12% referenced to the pre-contrast.

It is a well-known fact that cerebral white matter shows a slight increase of SI (about 2–3%) when a standard dose of paramagnetic contrast medium is administered.

Consequently, the normalization obtained with traditional imaging conditions, while providing the maximum resolution of the contrast (and thus useful from the qualitative diagnostic point of view) does not allow an appropriate quantitative analysis of the raising of the signal after the contrast.

The same procedure was repeated with the patient wearing a reversible helmet, of the type described in Example 8, to which a PVC tube was attached containing an aqueous solution of 1 mM of NiCl2. The SIr values obtained of the tissues being examined were divided by the SIst values of the standard solution contained in the reference tube, obtaining normalized pre-contrast SIn values of 0.362 and 0.314 for the healthy tissues and the diseased ones respectively. Similarly, post-contrast SIn were found to be 0.373 and 0.490 respectively, corresponding to signal increases after administration of the paramagnetic medium, of 3% for the healthy tissue (as expected) and 56% for the diseased one.

EXAMPLE 14

A healthy volunteer was given a helmet fitted with a tube containing a standard 1 mM solution of paramagnetic salt, as described in example 9, and was then inserted in a commercial MRI imager operating at 1.5T at different times for five consecutive days. The intensity of the SIr signal of the cerebral white matter obtained by Spin Echo images (SE 500/20/2; RR/TE/NEX) were determined with ROI techniques, taking care always to define the same ROI. The following SIr values were obtained: first day: 110±6; second day 118±5; third day: 4101±6; fourth day: 99±4; fifth day: 121±11.

This variability was due to the instability of the imager, with the result that it was not possible to make a precise direct comparison between images of the same zone taken in different days. An attempt was made to normalize the images, dividing SIr by the background noise, but also the signal/noise ratios obtained (SNR) showed a similar degree of variability, as a result of the oscillations of the equipment's background noise over time. Only after having determined the SIr/SIst=SIn ratios it was found that the signal intensity normalized with the method and with the standard of the invention had not undergone variations higher than 3% in the 5 days of the duration of the experiment.

We claim:

1. A device for standardization of signal intensity in the formation of magnetic resonance images of the human and animal body in an imager including at least one closed flexible tube made of a diamagnetic material, other than glass, filled with aqueous solutions or gels containing paramagnetic components, the said flexible tube being kept close to the body by a body positioning device inside the imager and fixed to the human body to maintain the tube in the required position during imaging, the body positioning device including cloth, rubber or plastic rings for holding the tube, said rings having ends releasably attached to one another by releasable fastening means.

* * * * *